US012672409B2

(12) United States Patent
Choi et al.

(10) Patent No.: US 12,672,409 B2
(45) Date of Patent: Jun. 30, 2026

(54) STRETCHABLE DISPLAY PANEL

(71) Applicant: KOREA ADVANCED INSTITUTE OF SCIENCE AND TECHNOLOGY, Daejeon (KR)

(72) Inventors: Kyung Cheol Choi, Daejeon (KR); Hag Seon Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 432 days.

(21) Appl. No.: 18/345,391

(22) Filed: Jun. 30, 2023

(65) Prior Publication Data

US 2024/0194845 A1 Jun. 13, 2024

(30) Foreign Application Priority Data

Dec. 13, 2022 (KR) ........................ 10-2022-0174094

(51) Int. Cl.
H01L 33/62 (2010.01)
G06F 1/16 (2006.01)
(Continued)

(52) U.S. Cl.
CPC ......... H10H 20/857 (2025.01); G06F 1/1652 (2013.01); H04M 1/0268 (2013.01); H10W 90/00 (2026.01)

(58) Field of Classification Search
CPC . H10H 20/857; G06F 1/1652; H01L 25/0753; H04M 1/0268; H10D 86/411;
(Continued)

(56) References Cited

U.S. PATENT DOCUMENTS

2021/0408159 A1    12/2021   Zhang et al.
2023/0214034 A1*    7/2023   Kwon ................. H01L 25/0753
345/173

FOREIGN PATENT DOCUMENTS

KR       1020170042426 A      4/2017
KR       1020170088013 A      8/2017
(Continued)

OTHER PUBLICATIONS

Office Action issued on Nov. 4, 2024, in corresponding Korean Application No. 10-2022-0174094, 21 pages.

*Primary Examiner* — Elmito Breval
(74) *Attorney, Agent, or Firm* — Maier & Maier, PLLC

(57) ABSTRACT

A stretchable display panel including a first light-emitting module and a second light-emitting module. The first light-emitting module includes a first body, a plurality of first connectors extending from the first body in different directions and each having a predetermined elastic force, first satellite portions extending from the first body in directions different from the directions of the plurality of first connectors, a first adhesive member disposed on the first body, and a first light-emitting element disposed on the first satellite portion. The second light-emitting module includes a second body disposed on the first adhesive member, a plurality of second connectors extending from the second body in different directions and each having a predetermined elastic force, a second satellite portion extending from the second body in a direction different from the directions of the plurality of second connectors and not overlapping the first satellite portion.

16 Claims, 21 Drawing Sheets

(51) Int. Cl.
*H04M 1/02* (2006.01)
*H10H 20/857* (2025.01)
*H10W 90/00* (2026.01)

(58) Field of Classification Search
CPC ............ H10K 2102/311; H10K 77/111; H10K
59/35; G09F 9/301
See application file for complete search history.

(56) References Cited

FOREIGN PATENT DOCUMENTS

| | | | |
|---|---|---|---|
| KR | 1020200017336 | A | 2/2020 |
| KR | 1020200081220 | A | 7/2020 |
| KR | 1020220027531 | A | 3/2022 |
| KR | 1020220031217 | A | 3/2022 |
| KR | 102412729 | B1 | 6/2022 |

* cited by examiner

DM

ISC

DP

DM-1

ISC

ADL

DP

PX

DR2

DR3 — ⊙ — DR1
DR5

DR4

PX2

AD2

II

STD2

BD2

II'

STRETCHABLE DISPLAY PANEL

CROSS-REFERENCE TO RELATED APPLICATIONS

This application claims the benefit under 35 U.S.C. § 119(a) of Korean Patent Application No. 10-2022-0174094, filed on Dec. 13, 2022, in the Korean Intellectual Property Office, which is incorporated herein by reference in its entirety.

FIELD

The present disclosure relates to a display panel, and more specifically, to a stretchable display panel that can be stretched by an externally applied force.

BACKGROUND

Display devices provide information to users by displaying various images on display screens. Generally, the display devices display information within assigned screens.

Recently, flexible display devices including flexible display modules having flexibility have been in development. Unlike flat panel display devices, the flexible display devices can be folded, rolled, bent, or stretched like paper. The flexible display devices whose shapes can be changed in various ways can be carried regardless of the existing screen size and can be easily placed on a curved object, improving user convenience.

In particular, in a stretchable display device that can be stretched in a predetermined direction, light-emitting elements and lines are disposed on a base member capable of being stretched, but unlike other flexible display devices, there is a problem in that a resolution varies when it is deformed. Since foldable or rollable displays are only folded or rolled and sizes of display panels do not change, there is no variation in resolution. However, a size of a display panel increases as the stretchable display device is stretched. In this case, since the total number of pixels does not change, there is a problem in that resolution is decreased.

SUMMARY

Embodiments relate to a stretchable display device that maintains a resolution even when an inside of the stretchable display device is stretched.

A stretchable display panel according to one embodiment of the present disclosure may include a first light-emitting module and a second light-emitting module. The first light-emitting module may include a first body, a plurality of first connectors extending from the first body in different directions and each having a predetermined elastic force, first satellite portions extending from the first body in directions different from the directions of the plurality of first connectors, a first adhesive member disposed on the first body, and a first light-emitting element disposed on the first satellite portion. The second light-emitting module may include a second body disposed on the first adhesive member, a plurality of second connectors extending from the second body in different directions and each having a predetermined elastic force, a second satellite portion extending from the second body in a direction different from the directions of the plurality of second connectors and not overlapping the first satellite portion, a second adhesive member disposed on the second body, and a second light-emitting element disposed on the second satellite portion.

The stretchable display panel may further include a third light-emitting module. The third light-emitting module may include a third body disposed on the second adhesive member, a plurality of third connectors extending from the third body in different directions and each having a predetermined elastic force, a third satellite portion extending from the third body in a direction different from the directions of the plurality of third connectors and not overlapping the first satellite portion and the second satellite portion, a third adhesive member disposed on the third body, and a third light-emitting element disposed on the third satellite portion.

The stretchable display panel may further include a fourth light-emitting module. The fourth light-emitting module may include a fourth body disposed on the third adhesive member, a plurality of fourth connectors extending from the fourth body in different directions and each having a predetermined elastic force, a fourth satellite portion extending from the fourth body in a direction different from the directions of the plurality of fourth connectors and not overlapping the first satellite portion to the third satellite portion, a fourth adhesive member disposed on the fourth body, and a fourth light-emitting element disposed on the fourth satellite portion.

The stretchable display panel may further include a fifth light-emitting module. The fifth light-emitting module may include a fifth body disposed on the fourth adhesive member, and a fifth light-emitting element disposed on the fifth body.

The fifth light-emitting element may be disposed between the first light-emitting element and the third light-emitting element on a flat surface.

The fifth light-emitting element may be disposed between the second light-emitting element and the fourth light-emitting element on a flat surface.

The stretchable display panel may further include a sixth light-emitting module. The fourth light-emitting element and the sixth light-emitting element may overlap in a first state, and the fourth light-emitting element and the sixth light-emitting element may not overlap in a second state.

Light emitted from the fourth light-emitting element may have the same color as light emitted from the sixth light-emitting element.

Both the fourth light-emitting element and the sixth light-emitting element may be turned on in the first state and the second state.

Any one of the fourth light-emitting element and the sixth light-emitting element may be turned on in the first state, and both the fourth light-emitting element and the sixth light-emitting element may be turned on in the second state.

The stretchable display panel may include a base member, a first light emission portion including a plurality of first light-emitting elements disposed on the base member, and a second light emission portion including a plurality of second light-emitting elements disposed on the base. In a first state in which the base member is not stretched, some of the plurality of first light-emitting elements may overlap some of the plurality of second light-emitting elements, and in a second state in which the base member is stretched, the plurality of first light-emitting elements may not overlap the plurality of second light-emitting elements.

The plurality of first light-emitting elements may be disposed on different layers.

The plurality of second light-emitting elements may be disposed on different layers.

In the first state, light-emitting elements overlapping each other among the plurality of first light-emitting elements and the plurality of second light-emitting elements may emit the same color of light.

In the first state, all light-emitting elements overlapping each other among the plurality of first light-emitting elements and the plurality of second light-emitting elements may be turned on.

In the first state, half of overlapping light-emitting elements among the plurality of first light-emitting elements and the plurality of second light-emitting elements may be turned on, the other half of the overlapping light-emitting elements thereof may be turned off, and in the second state, all the plurality of first light-emitting elements and the plurality of second light-emitting elements may be turned on.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
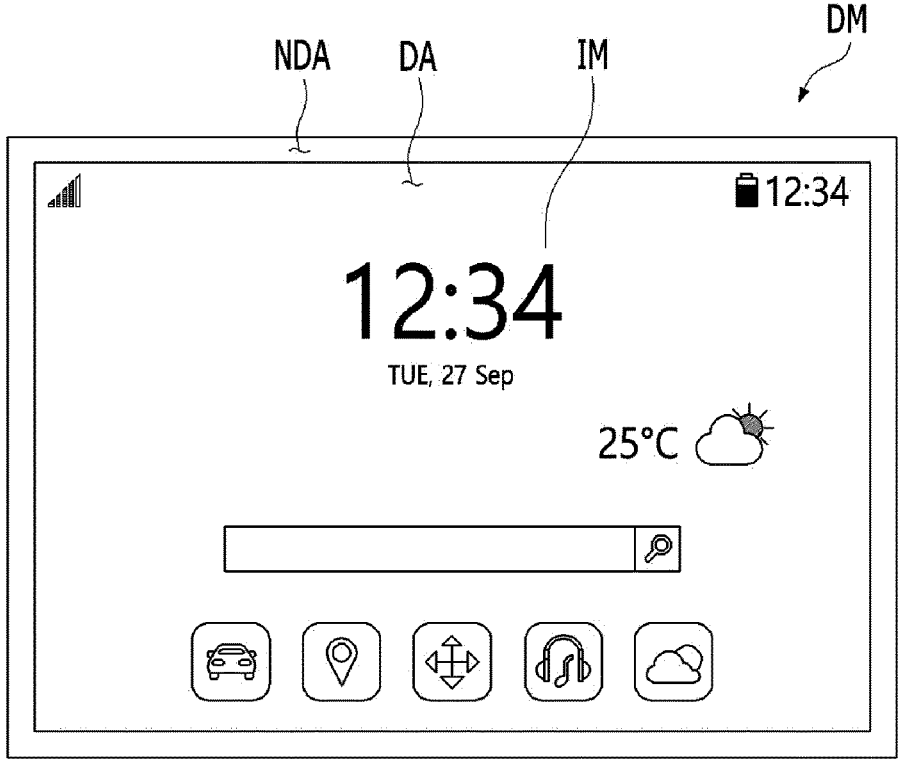
FIG. 1 is a diagram illustrating a display module according to an embodiment of the present disclosure.
Figure 1:
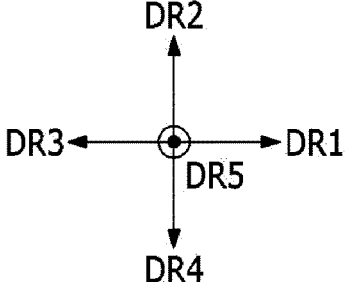

Hereinafter, embodiments of the present disclosure will be described with reference to the accompanying drawings.

In the drawings, proportions and dimensions of components are exaggerated to effectively describe the technical content. The term "and/or" includes one or more combinations that associated components can define.

The term "comprising" is used to specify that a feature, a number, a step, an operation, a component, an element, or a combination thereof described herein exists, and does not preclude the presence or addition of one or more other features, numbers, steps, operations, components, elements, or combinations thereof.

Figure 2:
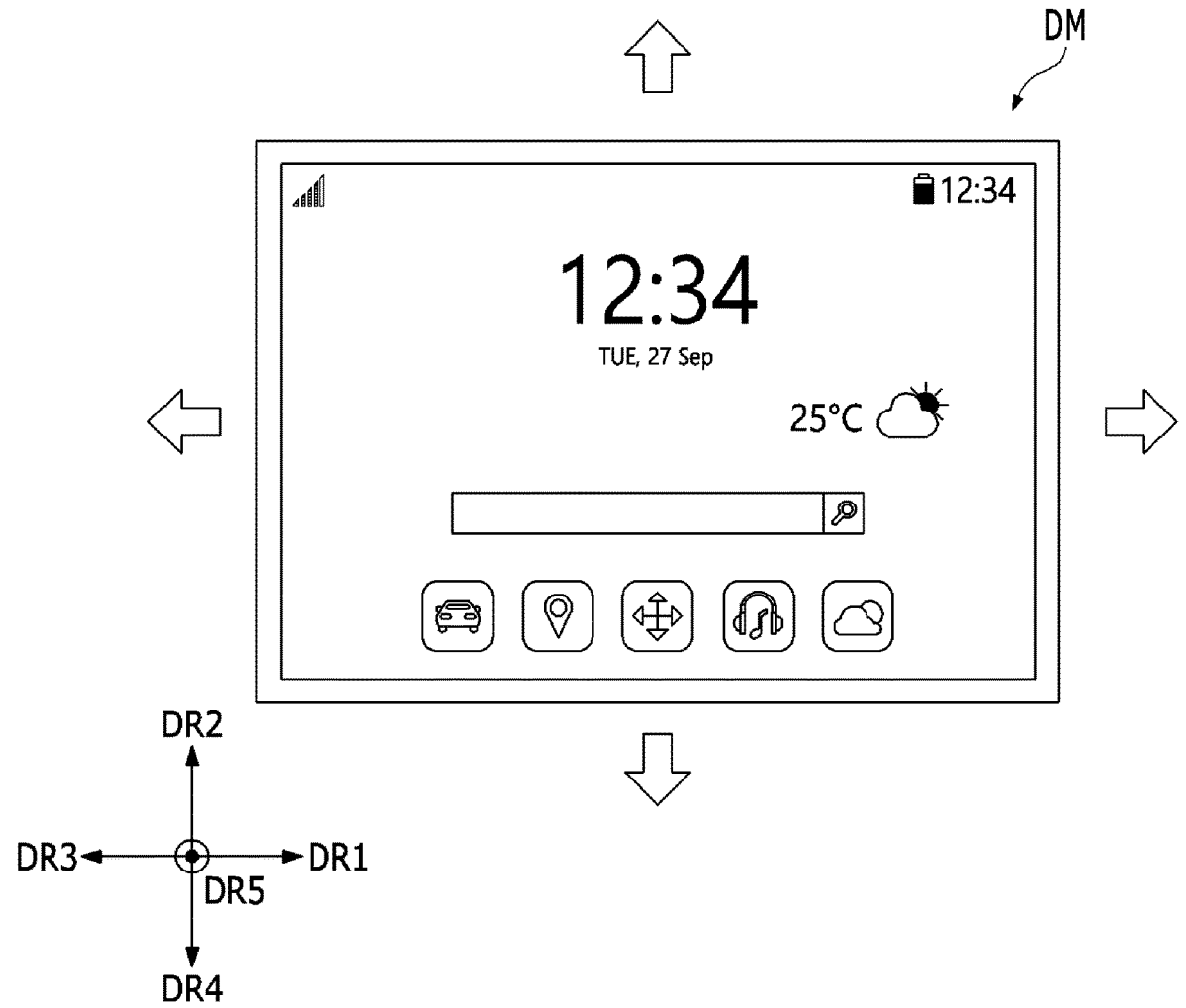
FIG. 2 is a diagram illustrating a display module according to an embodiment of the present disclosure.

FIGS. 1 and 2 show a display module DM according to one embodiment of the present disclosure. The display module DM shown in FIG. 1 is in a state before being stretched (hereinafter referred to as a first state). The display module DM shown in FIG. 2 is in a state in which it is stretched in a predetermined direction by an externally applied force (hereinafter referred to as a second state).

The display module DM may be mounted on large electronic devices such as televisions and monitors, as well as small and medium-sized electronic devices such as mobile phones, tablets, car navigation systems, game consoles, and smart watches.

A display area DA and a non-display area NDA may be defined in the display module DM.

The display area DA where an image IM is displayed is parallel to a plane defined by a first direction axis DR1 and a second direction axis DR2. A third direction axis DR3 indicates a direction opposite to the first direction axis DR1, and a fourth direction axis DR4 indicates a direction opposite to the second direction axis DR2.

A fifth direction axis DR5 indicates a normal direction of the display area DA, that is, a thickness direction of a display device DD. A front surface (or an upper surface) and a rear surface (or a lower surface) of each member are distinguished by the fifth direction axis DR5. However, directions indicated by the first to fifth direction axes DR1, DR2, DR3, DR4, and DR5 are a relative concept and may be changed to other directions Hereinafter, first to fifth directions are directions indicated by the first to fifth direction axes DR1, DR2, DR3, DR4, and DR5 and the same reference numerals are given to the first to fifth directions.

A shape of the display area DA shown in FIG. 1 is illustrative, and the shape of the display area DA may be changed without limitation, as necessary.

The non-display area NDA is an area adjacent to the display area DA and is an area in which the image IM is not displayed. A bezel area of the display device DD may be defined by the non-display area NDA.

The non-display area NDA may surround the display area DA. However, the present disclosure is not limited thereto, and the shape of the display area DA and the shape of the non-display area NDA may be designed relative to each other.

Figure 3:
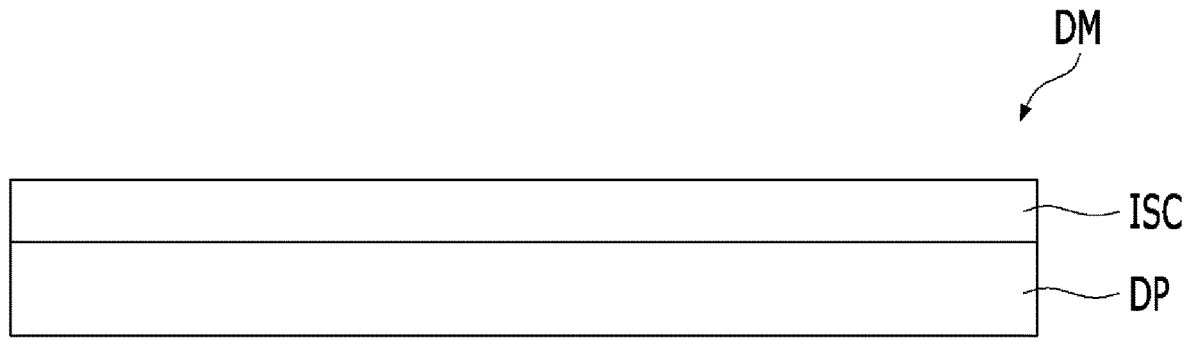
FIG. 3 is a cross-sectional view illustrating the display module according to an embodiment of the present disclosure.
Figure 4:
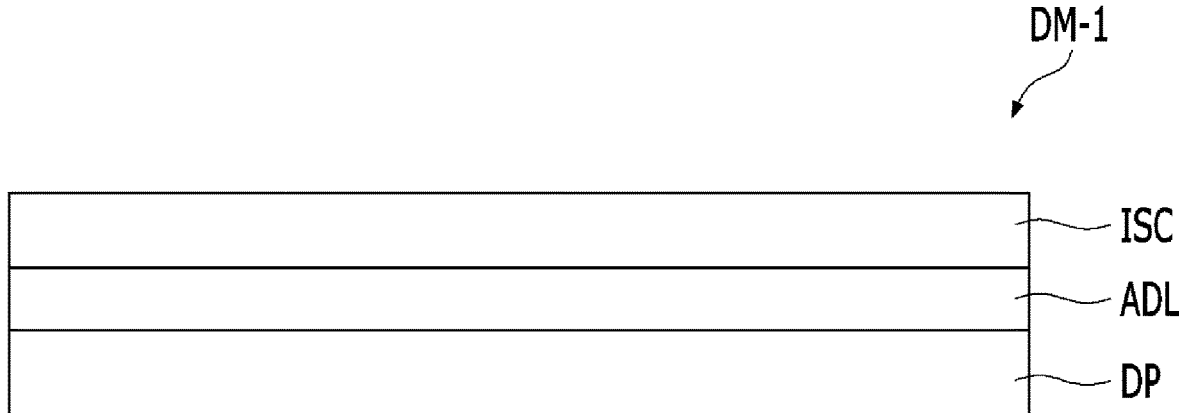
FIG. 4 is a cross-sectional view illustrating the display module according to an embodiment of the present disclosure.

FIGS. 3 and 4 are cross-sectional views illustrating display modules DM and DM-1 according to one embodiment of the present disclosure, respectively.

Referring to FIG. 3, the display module DM may include a stretchable display panel DP (hereinafter referred to as a display panel) and an input sensing circuit ISC. The input sensing circuit ISC may detect a touch and/or a pressure applied from the outside.

The input sensing circuit ISC may be directly disposed on a thin-film encapsulation layer (not shown) of the display panel DP. Here, "directly disposed" means that the input sensing circuit ISC is placed on the display panel DP without a separate adhesive member.

Referring to FIG. 4, the display module DM-1 may include a display panel DP, an input sensing circuit ISC, and an adhesive layer ADL. The display panel DP and the input sensing circuit ISC may be bonded by the adhesive layer ADL.

Figure 5:
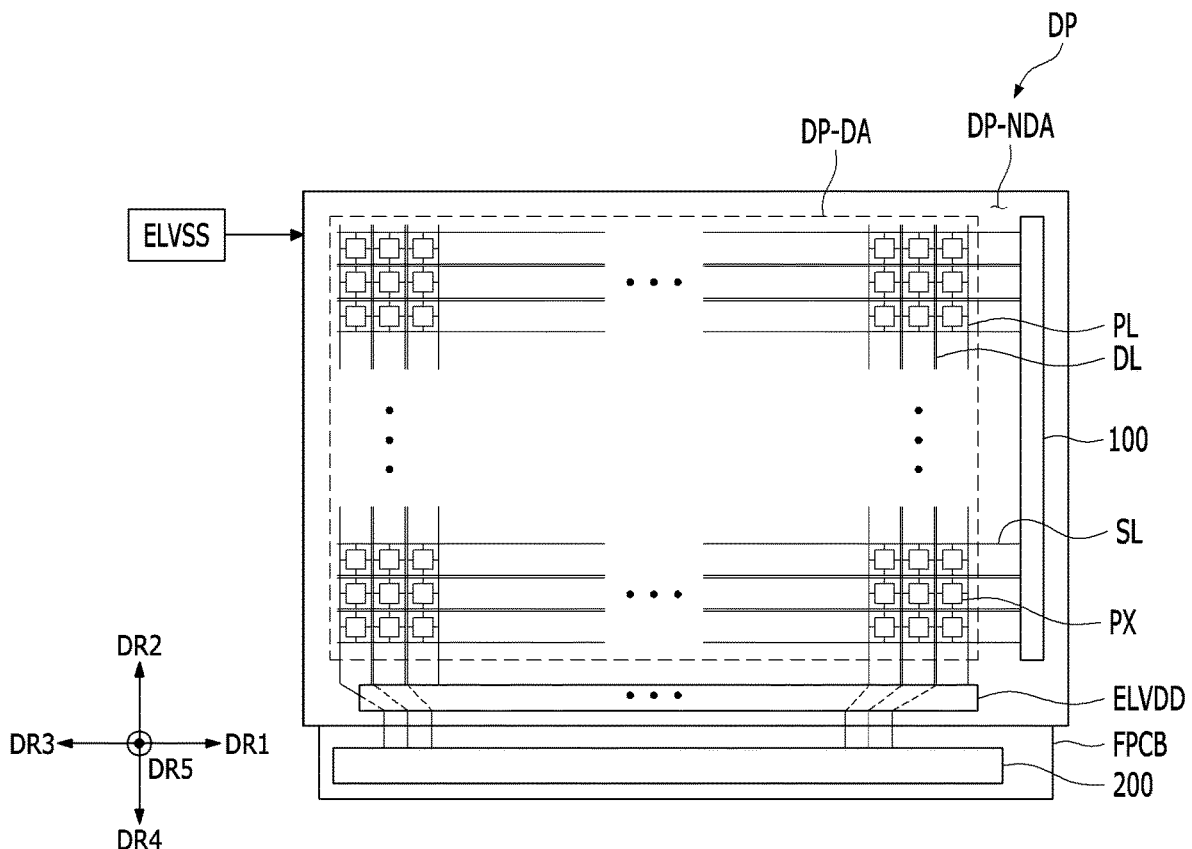
FIG. 5 is a diagram illustrating a display panel according to one embodiment of the present disclosure.

FIG. 5 is a diagram illustrating the display panel DP according to one embodiment of the present disclosure.

The display panel DP includes a display area DP-DA and a non-display area DP-NDA on a flat surface. In the present embodiment, the non-display area DP-NDA may be defined along an edge of the display area DP-DA. The display area DP-DA and the non-display area DP-NDA of the display panel DP may correspond to the display area DA and the non-display area NDA of the display module DM shown in FIG. 1, respectively.

The display panel DP may include a scan driver 100, a data driver 200, a plurality of scan lines SL, a plurality of data lines DL, a plurality of power lines PL, and a plurality of pixels PX (hereinafter referred to as pixels). The pixels PX are disposed in the display area DP-DA.

The scan driver 100 may include a scan driving part and a light emission control driving part.

The scan driving part generates scan signals and sequentially outputs the generated scan signals to the scan lines SL. The light emission control driving part generates light emission control signals and outputs the generated light emission control signals to light emission control lines (not shown).

In another embodiment of the present disclosure, the scan driving part and the light emission control driving part may not be divided within the scan driver 100 and may be formed as a single circuit.

The scan driver 100 may include a plurality of thin film transistors formed through the same process as a driving circuit of the pixels PX, for example, a low temperature polycrystalline silicon (LTPS) process or a low temperature polycrystalline oxide (LTPO) process.

The data driver 200 outputs data signals to the data lines DL. The data signals are analog voltages corresponding to gradation values of image data.

In one embodiment of the present disclosure, the data driver 200 may be mounted on a printed circuit board FPCB, and the printed circuit board FPCB may be connected to pads disposed at one ends of the data lines DL. However, the present disclosure is not limited thereto, and the data driver 200 may be directly mounted on the display panel DP.

The scan lines SL may extend in the first direction DR1 and may be disposed in the second direction DR2. The scan lines SL may provide the scan signals to the pixels PX.

The data lines DL extend in the second direction DR2 and are disposed in the first direction DR1. The data lines DL may provide the data signals to corresponding pixels PX.

The power lines PL extend in the second direction DR2 and are disposed in the first direction DR1. The power lines PL may provide first power ELVDD to corresponding pixels PX.

Each of the plurality of pixels PX is connected to a corresponding scan line among the scan lines SL, a corresponding data line among the data lines DL, and a corresponding power line among the power lines PL.

Second power ELVSS may be provided to the pixels PX of the display panel DP.

Figure 6:
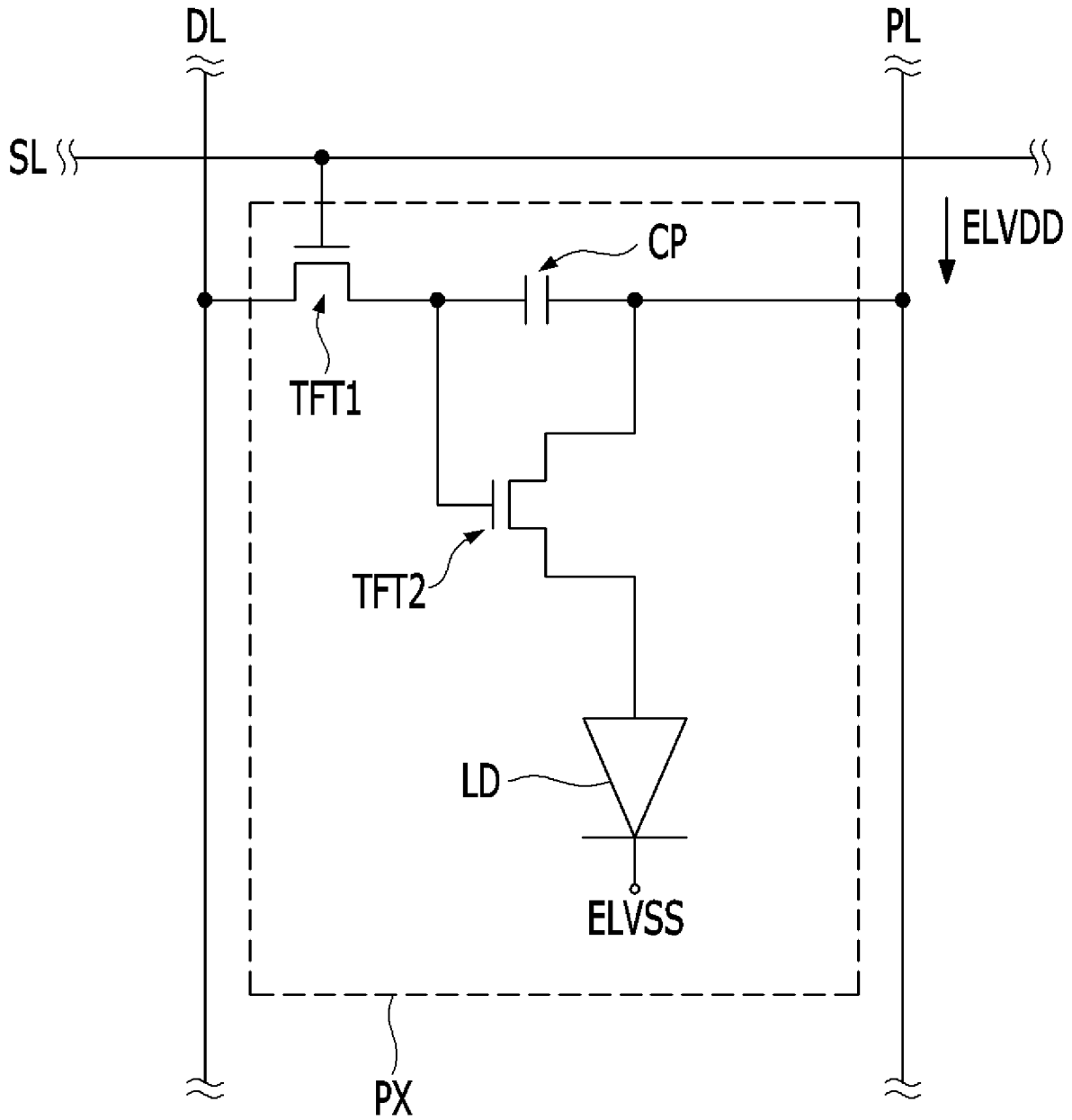
FIG. 6 is an exemplary diagram illustrating an equivalent circuit corresponding to a pixel of FIG. 5.

FIG. 6 shows an equivalent circuit diagram of the pixel PX shown in FIG. 5. FIG. 6 exemplarily illustrates any one scan line SL, any one data line DL, and a pixel PX connected to the power line PL. The configuration of the pixel PX is not limited thereto and may be implemented with modifications.

The pixel PX includes a light-emitting element LD as a display element. The light-emitting element LD may be a top emission type diode or a bottom emission type diode. Alternatively, the light-emitting element LD may be a dual emission type diode. In another embodiment of the present disclosure, the light-emitting element LD may be a micro light-emitting diode (LED).

The pixel PX includes a first transistor TFT1 (or a switching transistor), a second transistor TFT2 (or a driving transistor), and a capacitor CP as a circuit unit for driving the light-emitting element LD. The light-emitting element LD generates light in response to electrical signals provided from the transistors TFT1 and TFT2.

The first transistor TFT1 outputs the data signal applied to the data line DL in response to the scan signal applied to the scan line SL. The capacitor CP charges a voltage corresponding to the data signal received from the first transistor TFT1.

The second transistor TFT2 is connected to the light-emitting element LD. The second transistor TFT2 controls the driving current flowing to the light-emitting element LD in response to an amount of electric charge stored in the capacitor CP. The light-emitting element LD emits light during a turn-on period of the second transistor TFT2.

Figure 7:
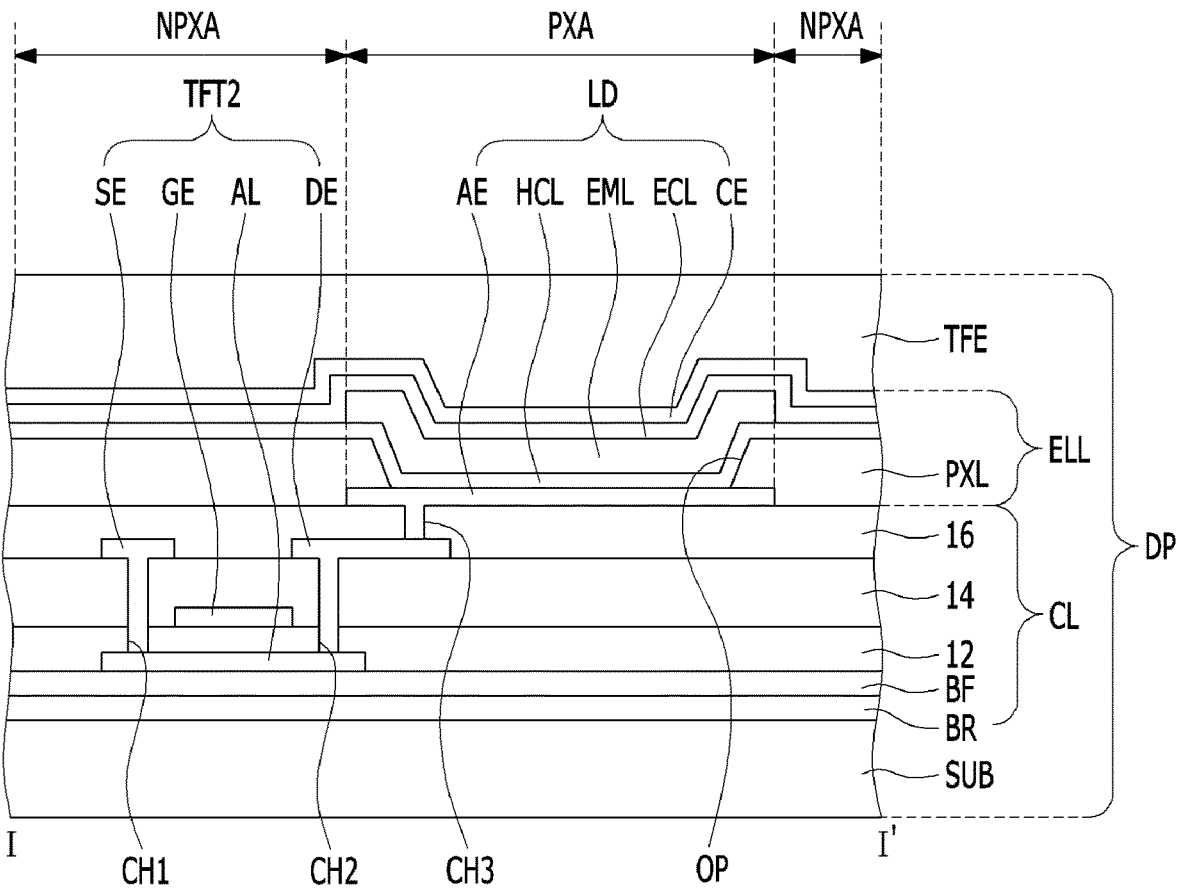
FIG. 7 is an exemplary diagram illustrating a portion of a cross section of the pixel.

FIG. 7 is an exemplary diagram illustrating a portion of a cross section of the pixel PX.

As shown in FIG. 7, a circuit layer CL is disposed on a base layer SUB. Semiconductor patterns AL of the second transistor TFT2 are disposed on the base layer SUB. The semiconductor patterns AL may be selected identically or differently from among amorphous silicon, polysilicon, and a metal oxide semiconductor.

The circuit layer CL may include organic/inorganic layers BR, BL, 12, 14, and 16, the first transistor TFT1, and the second transistor TFT2. The organic/inorganic layers BR, BF, 12, 14, and 16 may include functional layers BR and BF, a first insulating layer 12, a second insulating layer 14, and a third insulating layer 16.

The functional layers BR and BF may be disposed on one surface of the base layer SUB. The functional layers BR and BF include at least one of a barrier layer BR or a buffer layer BF. The semiconductor pattern AL may be disposed on the barrier layer BR or the buffer layer BF.

The first insulating layer 12 covering the semiconductor pattern AL is disposed on the base layer SUB. The first insulating layer 12 includes an organic layer and/or an inorganic layer. In particular, the first insulating layer 12 may include a plurality of inorganic thin films. The plurality of inorganic thin films may include a silicon nitride layer and a silicon oxide layer.

A control electrode GE of the second transistor TFT2 is disposed on the first insulating layer 12. Although not shown in the drawing, a control electrode of the first transistor TFT1 (see FIG. 4) may also be disposed on the first insulating layer 12. The control electrode GE may be manufactured according to the same photolithography process as the scan line SL. In other words, the control electrode GE may be made of the same material and the same stacked structure as the scan lines SL and may be disposed on the same layer as the scan lines SL.

The second insulating layer 14 covering the control electrode GE is disposed on the first insulating layer 12. The second insulating layer 14 includes an organic layer and/or an inorganic layer. In particular, the second insulating layer 14 may include a plurality of inorganic thin films. The plurality of inorganic thin films may include a silicon nitride layer and a silicon oxide layer.

The data line DL may be disposed on the second insulating layer 14. An input electrode SE and an output electrode DE of the second transistor TFT2 are disposed on the second insulating layer 14. Although not shown in the drawing, an input electrode and an output electrode of the first transistor TFT1 are also disposed on the second insulating layer 14. The input electrode SE branches off from a corresponding data line among the data lines DL. The power line PL may be disposed on the same layer as the data lines DL. The input electrode SE may branch off from the power line PL.

Some electrodes of the capacitor CP are disposed on the second insulating layer 14. Some of the electrodes of the capacitor CP may be manufactured according to the same photolithography process, may be made of the same material, may have the same stacked structure as the data lines DL and the power lines PL, and may be disposed on the same layer as the data lines DL and the power lines PL.

The input electrode SE and the output electrode DE are connected to the semiconductor pattern AL through a first through-hole CH1 and a second through-hole CH2 which pass through the first insulating layer 12 and the second insulating layer 14. Meanwhile, in another embodiment of the present disclosure, the first transistor TFT1 and the second transistor TFT2 may each be modified into a bottom gate structure and implemented.

The third insulating layer 16 covering the input electrode SE and the output electrode DE is disposed on the second insulating layer 14. The third insulating layer 16 includes an organic layer and/or an inorganic layer. In particular, the third insulating layer 16 may include an organic material in order to provide a flat surface.

Any one among the first insulating layer 12, the second insulating layer 14, and the third insulating layer 16 may be omitted according to a circuit structure of the pixel. The second insulating layer 14 and the third insulating layer 16 may each be defined as an interlayer insulating layer. The interlayer insulating layer is disposed between a conductive pattern disposed on an upper portion and a conductive pattern disposed on a lower portion based on the interlayer insulating layer to insulate the conductive patterns.

A light-emitting element layer ELL is disposed on the third insulating layer 16. The light-emitting element layer ELL includes a pixel-defining layer PXL and a light-emitting element LD. An anode AE is disposed on the third insulating layer 16. The anode AE is connected to the output electrode DE of the second transistor TFT2 through a third through-hole CH3 passing through the third insulating layer 16. An opening OP is defined in the pixel-defining layer PXL. The opening OP of the pixel-defining layer PXL exposes a portion of the anode AE.

The light-emitting element layer ELL includes a light emission area PXA and a non-light emission area NPXA adjacent to the light emission area PXA. The non-light emission area NPXA may surround the light emission area PXA. In the present embodiment, the light emission area PXA is defined to correspond to the anode AE. However, the light emission area PXA is not limited thereto, and it is sufficient for the light emission area PXA to be defined as an area where light is generated. The light emission area PXA may be defined to correspond to a partial area of the anode AE exposed by the opening OP.

A hole control layer HCL may be commonly disposed in the light emission area PXA and the non-light emission area NPXA. Although not separately shown in the drawing, a common layer such as the hole control layer HCL may be commonly formed in the plurality of pixels PX.

A light-emitting layer EML is disposed on the hole control layer HCL. The light-emitting layer EML may be disposed only in an area corresponding to the opening OP. That is, the light-emitting layer EML may be formed separately in each of the plurality of pixels PX.

The light-emitting layer EML may include an organic material or an inorganic material.

An electron control layer ECL is disposed on the light-emitting layer EML. A cathode CE is disposed on the electron control layer ECL. The cathode CE is commonly disposed in the plurality of pixels PX.

Although the patterned light-emitting layer EML has been illustrated in the present embodiment, the light-emitting layer EML may be commonly disposed in the plurality of pixels PX. In addition, the light-emitting layer EML may have a multi-layered structure.

In the present embodiment, a thin-film encapsulation layer TFE directly covers the cathode CE. In one embodiment of the present disclosure, a capping layer may be further disposed to cover the cathode CE. In this case, the thin-film encapsulation layer TFE directly covers the capping layer. The thin-film encapsulation layer TFE may include an organic layer containing an organic material and an inorganic layer containing an inorganic material.

Figure 8A:
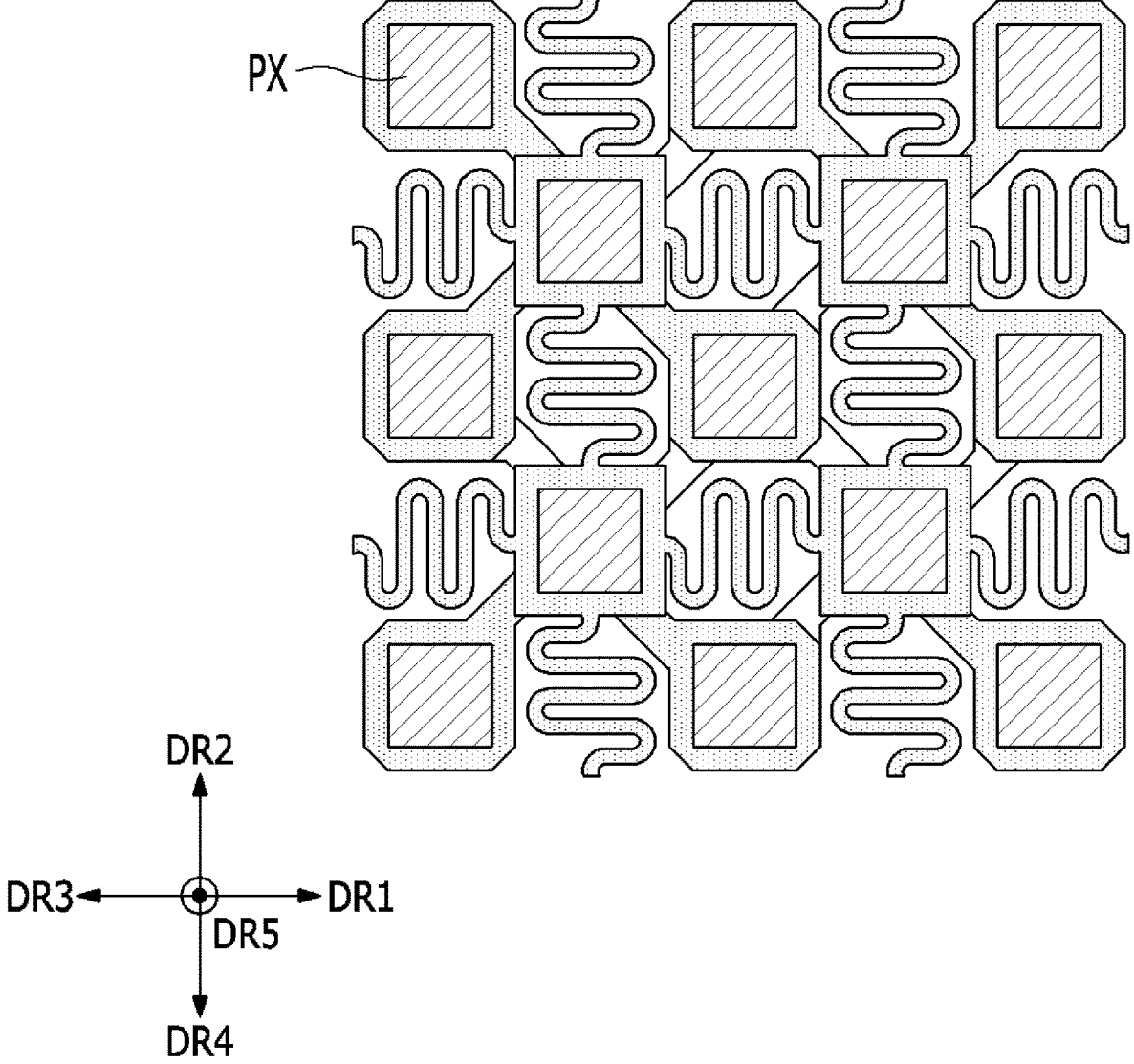
FIG. 8A is an enlarged view illustrating a portion of the display panel when the display module according to one embodiment of the present disclosure is in a first state of FIG. 1.
Figure 8B:
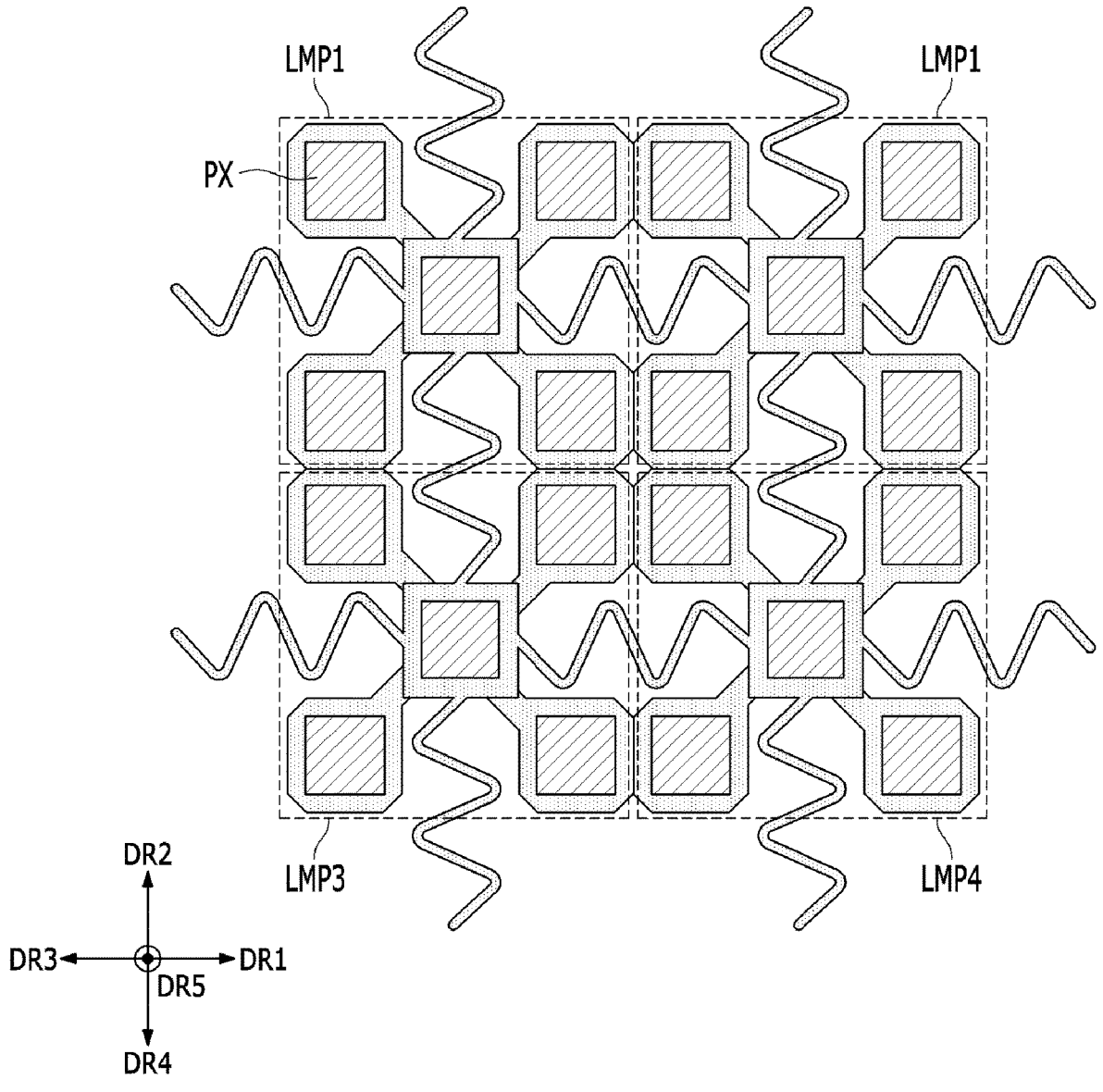
FIG. 8B is an enlarged view illustrating a portion of the display panel when the display module according to one embodiment of the present disclosure is in a second state of FIG. 2.

FIG. 8A is an enlarged view illustrating a portion of the display panel DP when the display module DM according to one embodiment of the present disclosure is in the first state of FIG. 1. FIG. 8B is an enlarged view illustrating a portion of the display panel DP when the display module DM according to one embodiment of the present disclosure is in the second state of FIG. 2.

The display panel DP may include a plurality of light emission portions LMP1, LMP2, LMP3, and LMP4. Each of the light emission portions LMP1, LMP2, LMP3, and LMP4 may include the plurality of pixels PX. Referring to FIG. 8B, each of the light emission portions LMP1, LMP2, LMP3, and LMP4 has been illustrated to include five pixels PX, but the present disclosure is not limited thereto.

In the first state, some of the pixels PX of the light emission portions LMP1, LMP2, LMP3, and LMP4 may overlap each other in the fifth direction DR5. Thus, pixels covered by other pixels among the pixels PX may not be visually recognized by a user.

In one embodiment of the present disclosure, all the pixels PX of the first light emission portion LMP1 may be disposed on different layers. In another embodiment of the present disclosure, at least some of the pixels PX of the first light emission portion LMP1 may be disposed on different layers.

In one embodiment of the present disclosure, all the pixels PX of the second light emission portion LMP2 may be disposed on different layers. In another embodiment of the present disclosure, at least some of the pixels PX of the second light emission portion LMP2 may be disposed on different layers.

In one embodiment of the present disclosure, all the pixels PX of the third light emission portion LMP3 may be disposed on different layers. In another embodiment of the present disclosure, at least some of the pixels PX of the third light emission portion LMP3 may be disposed on different layers.

In one embodiment of the present disclosure, all the pixels PX of the fourth light emission portion LMP4 may be disposed on different layers. In another embodiment of the present disclosure, at least some of the pixels PX of the fourth light emission portion LMP4 may be disposed on different layers.

In the second state, the pixels PX of the light emission portions LMP1, LMP2, LMP3, and LMP4 may not overlap each other in the fifth direction DR5. Thus, the pixels PX may not be covered by other pixels and may be visually recognized by the user. Therefore, even when the display panel DP is stretched, the resolution may be maintained without decreasing.

In one embodiment of the present disclosure, in the first state, the light-emitting elements LD of overlapping pixels among the pixels PX may emit light of the same color.

In one embodiment of the present disclosure, in the first state, all the light-emitting elements LD of overlapping pixels among the pixels PX may be turned on. Thus, when the display panel DP is changed from the first state to the second state, the resolution may be consistently maintained.

In one embodiment of the present invention, in the first state, half of the light-emitting elements LD of overlapping pixels among the pixels PX may be turned on, and the other half of the light-emitting elements LD thereof may be turned off. Specifically, among the light-emitting elements LD of overlapping pixels of the pixels PX, the light-emitting elements LD disposed in the upper portion may be turned on, and the light-emitting elements LD disposed in the lower portion may be turned off. In the second state, all the light-emitting elements LD of the pixels PX may be turned on. Since the light-emitting elements LD disposed in the lower portion are not visually recognized by the user anyway in the first state, the light-emitting elements LD disposed in the lower portion are turned off in the first state so that power consumption of the display panel DP may be reduced.

Hereinafter, stacked structures of the light emission portions LMP1, LMP2, LMP3, and LMP4 will be described in detail.

Figure 9A:
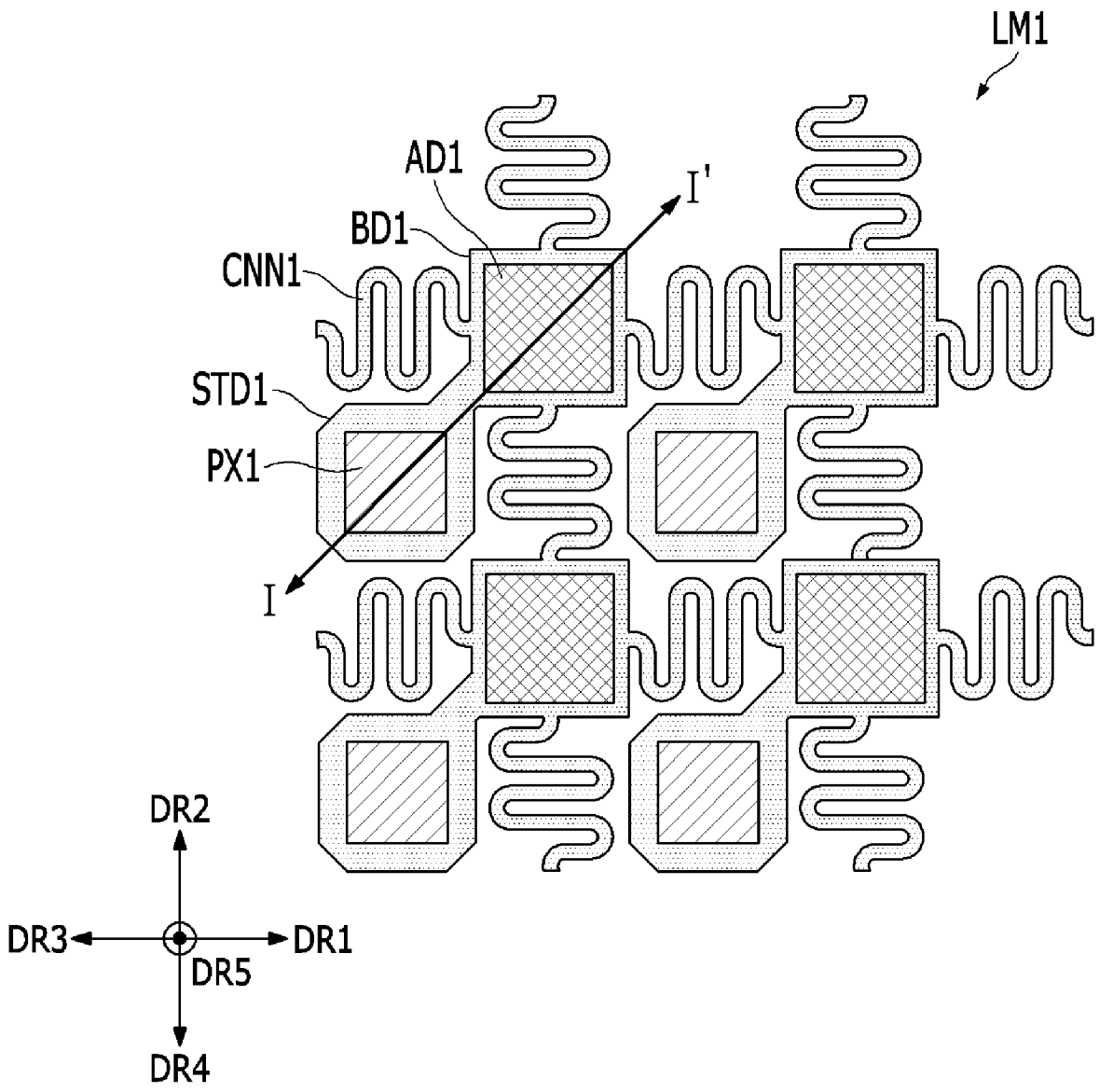
FIG. 9A is an exemplary diagram illustrating a first light-emitting module according to one embodiment of the present disclosure.
Figure 9B:
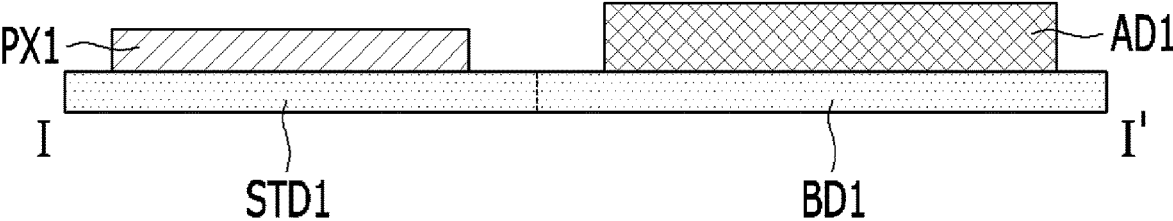
FIG. 9B is an exemplary diagram illustrating a portion of a cross section along line I-I' of FIG. 9A.
Figure 10A:
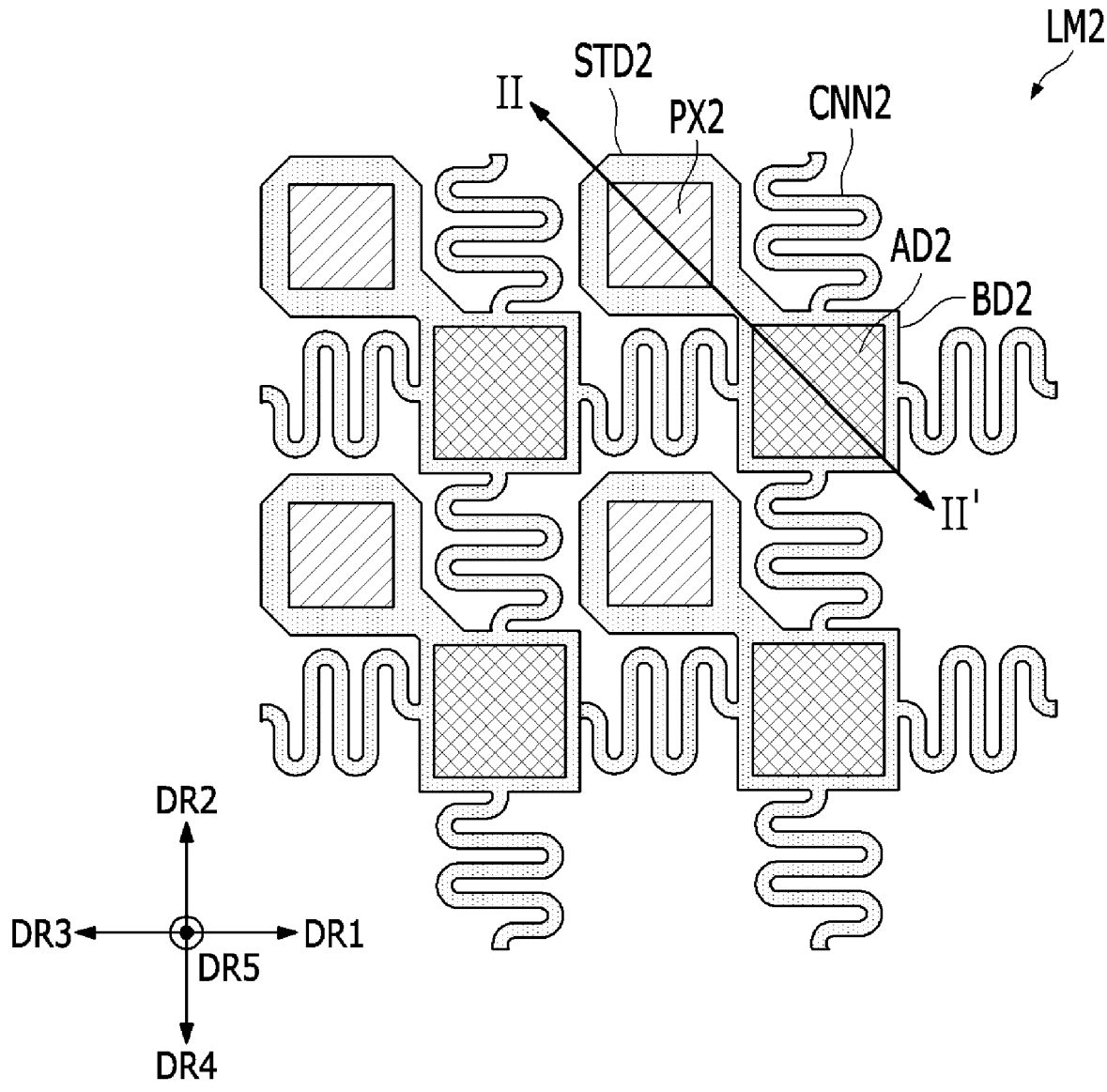
FIG. 10A is an exemplary diagram illustrating a second light-emitting module according to one embodiment of the present disclosure.
Figure 10B:
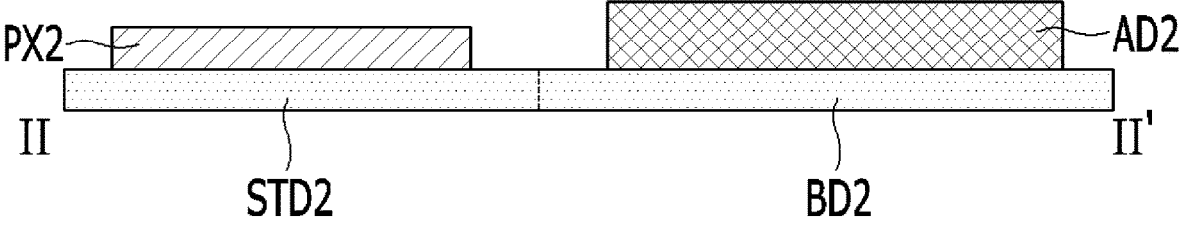
FIG. 10B is an exemplary diagram illustrating a portion of a cross section along line II-II' of FIG. 10A.
Figure 11A:
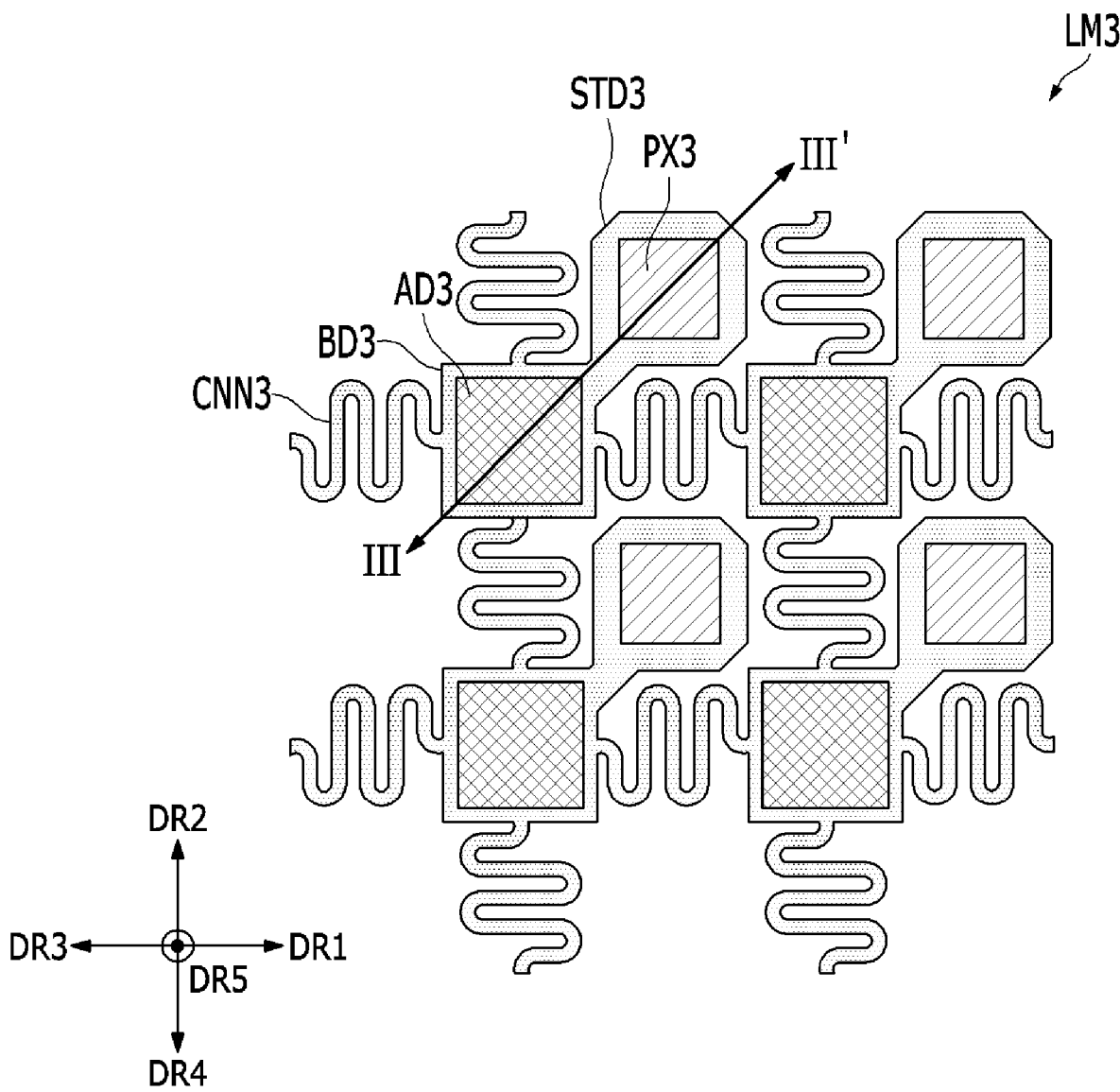
FIG. 11A is an exemplary diagram illustrating a third light-emitting module according to one embodiment of the present disclosure.
Figure 11B:
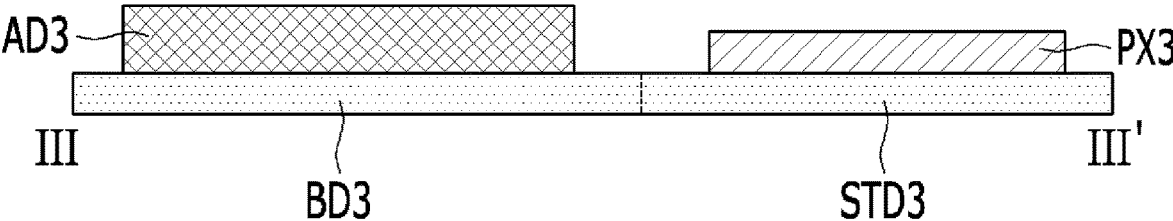
FIG. 11B is an exemplary diagram illustrating a portion of a cross section along line III-III' of FIG. 11A.
Figure 12A:
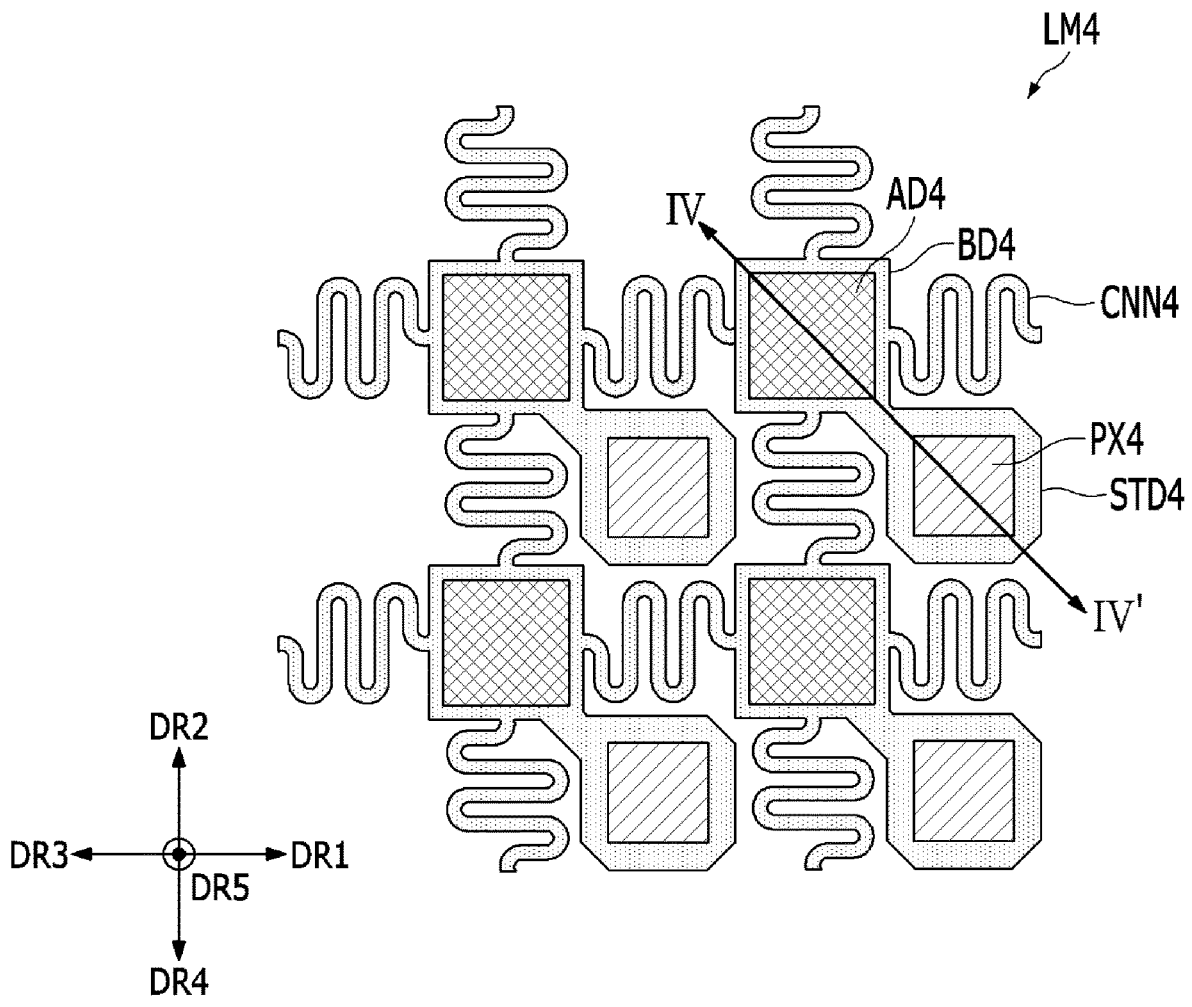
FIG. 12A is an exemplary diagram illustrating a fourth light-emitting module according to one embodiment of the present disclosure.
Figure 12B:
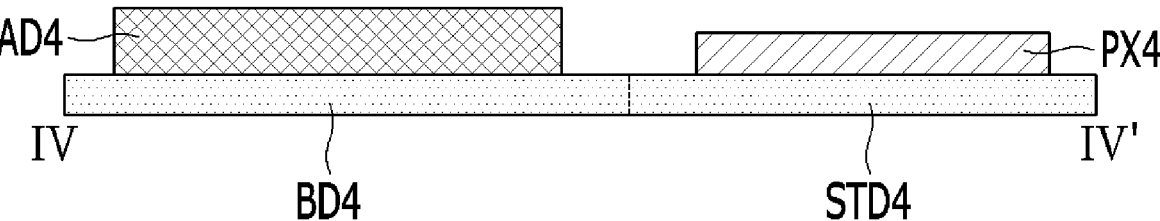
FIG. 12B is an exemplary diagram illustrating a portion of a cross section along line IV-IV' of FIG. 12A.

FIG. 9A is an exemplary diagram illustrating a first light-emitting module LM1 according to one embodiment of the present disclosure. FIG. 9B is an exemplary diagram illustrating a portion of a cross section along line I-I' of FIG. 9A. FIG. 10A is an exemplary diagram illustrating a second light-emitting module LM2 according to one embodiment of the present disclosure. FIG. 10B is an exemplary diagram illustrating a portion of a cross section along line II-II' of FIG. 10A. FIG. 11A is an exemplary diagram illustrating a third light-emitting module LM3 according to one embodiment of the present disclosure. FIG. 11B is an exemplary diagram illustrating a portion of a cross section along line III-III' of FIG. 11A. FIG. 12A is an exemplary diagram illustrating a fourth light-emitting module LM4 according to one embodiment of the present disclosure. FIG. 12B is an exemplary diagram illustrating a portion of a cross section along line IV-IV' of FIG. 12A. FIG. 13A is an exemplary diagram illustrating a fifth light-emitting module LM5 according to one embodiment of the present disclosure.

The light emission portions LMP1, LMP2, LMP3, and LMP4 shown in FIGS. 9A and 9B may be formed by a stacked structure of the first light-emitting module LM1, the second light-emitting module LM2, the third light-emitting module LM3, the fourth light-emitting module LM4, and an additional component.

Referring to FIG. 9A, the first light-emitting module LM1 may include first bodies BD1, first connectors CNN1, first satellite portions STD1, first adhesive members AD1, and first pixels PX1.

The first body BD1 may include polyethylene terephthalate (PET), polyimide (PI), polyetheretherketone (PEEK), transparent polyimide (colorless polyimide (CPI)), polydimethylsiloxane (PDMS), polyurethane (PU), or thermoplastic polyurethane (TPU).

The first connectors CNN1 may extend from the first body BD1 in different directions. FIG. 9A illustrates that first connectors CNN1 extend from first body BD1 in the first to fourth directions DR1 to DR4. The first connectors CNN1 may each have a predetermined elastic force. Each of the first connectors CNN1 may have an elastic force due to a structure thereof or by including AgNW, carbon nanotubes (CNTs), graphene, or a conductive polymer which is a stretchable material.

Due to the elastic force of each of the first connectors CNN1, the first bodies BD1 may be moved away from and toward each other. Therefore, the display panel DP may be changed from the first state to the second state or from the second state to the first state.

The first satellite portion STD1 may extend from the first body BD1 in a direction different from the direction of the first connector CNN1. FIG. 9A exemplarily illustrates that the first satellite portion STD1 extends in a direction between the third and fourth directions DR3 and DR4.

The first adhesive member AD1 may be disposed on the first body BD1. In one embodiment of the present disclosure, the first adhesive member AD1 may include an elastomeric substrate such as PDMS, PU, or TPU. Alternatively, the first adhesive member AD1 may contain an acrylic adhesive or an epoxy adhesive, which has strong adhesion.

The first pixel PX1 may be disposed on the first satellite portion STD1. The first pixel PX1 may include a first light-emitting element.

Referring to FIG. 9B, a thickness of the first adhesive member AD1 may be greater than a thickness of the first pixel PX1. Thus, in the process of changing the display panel DP to the first state or the second state, the first pixel PX1 may not be damaged.

Although not shown in FIG. 9B, a base member may be disposed below the first satellite portion STD1 and the first body BD1. The base member may be the base layer SUB (see FIG. 7) or a separate component having stretchability.

Referring to FIG. 10A, the second light-emitting module LM2 may include second bodies BD2, second connectors CNN2, second satellite portions STD2, second adhesive members AD2, and second pixels PX2.

The second body BD2 may be disposed on the first adhesive member AD1.

The second satellite portion STD2 may extend from the second body BD2 in a direction different from directions of the second connectors CNN2. The second satellite portion STD2 does not overlap the first satellite portion STD1 in the fifth direction DR5. FIG. 10A exemplarily illustrates that the second satellite portion STD2 extends in a direction between the second direction DR2 and the third direction DR3.

The second adhesive member AD2 may be disposed on the second body BD2.

The second pixel PX2 may be disposed on the second satellite portion STD2. The second pixel PX2 may include a second light-emitting element.

In addition to the above description, other descriptions of FIGS. 10A and 10B are substantially the same as those described in FIGS. 9A and 9B and thus will be omitted here.

Referring to FIG. 11A, the third light-emitting module LM3 includes third bodies BD3, third connectors CNN3, third satellite portions STD3, third adhesive members AD3, and third pixels PX3.

The third body BD3 may be disposed on the second adhesive member AD2.

The third satellite portion STD3 may extend from the third body BD3 in a direction different from directions of the third connectors CNN3. The third satellite portion STD3 does not overlap the first satellite portion STD1 and the second satellite portion STD2 in the fifth direction DR5. FIG. 11A exemplarily illustrates that the third satellite portion STD3 extends in a direction between the first direction DR1 and the second direction DR2.

The third adhesive member AD3 may be disposed on the third body BD3.

The third pixel PX3 may be disposed on the third satellite portion STD3. The third pixel PX3 may include a third light-emitting element.

In addition to the above description, other descriptions of FIGS. 11A and 11B are substantially the same as those described in FIGS. 9A and 9B and thus will be omitted here.

Referring to FIG. 12A, the fourth light-emitting module LM4 may include fourth bodies BD4, fourth connectors CNN4, fourth satellite portions STD4, fourth adhesive members AD4, and fourth pixels PX4.

The fourth body BD4 may be disposed on the third adhesive member AD3.

The fourth satellite portion STD4 may extend from the fourth body BD4 in a direction different from directions of the fourth connectors CNN4. The fourth satellite portion STD4 does not overlap the first satellite portion STD1, the second satellite portion STD2, and the third satellite portion STD3 in the fifth direction DR5. FIG. 12A exemplarily illustrates that the fourth satellite portion STD4 extends in a direction between the first direction DR1 and the fourth direction DR4.

The fourth adhesive member AD4 may be disposed on the fourth body BD4. In another embodiment of the present disclosure, the fourth adhesive member AD4 may be omitted.

The fourth pixel PX4 may be disposed on the fourth satellite portion STD4. The fourth pixel PX4 may include a fourth light-emitting element.

In addition to the above description, other descriptions of FIGS. 12A and 12B are substantially the same as those described in FIGS. 9A and 9B and thus will be omitted here.

Figure 13:
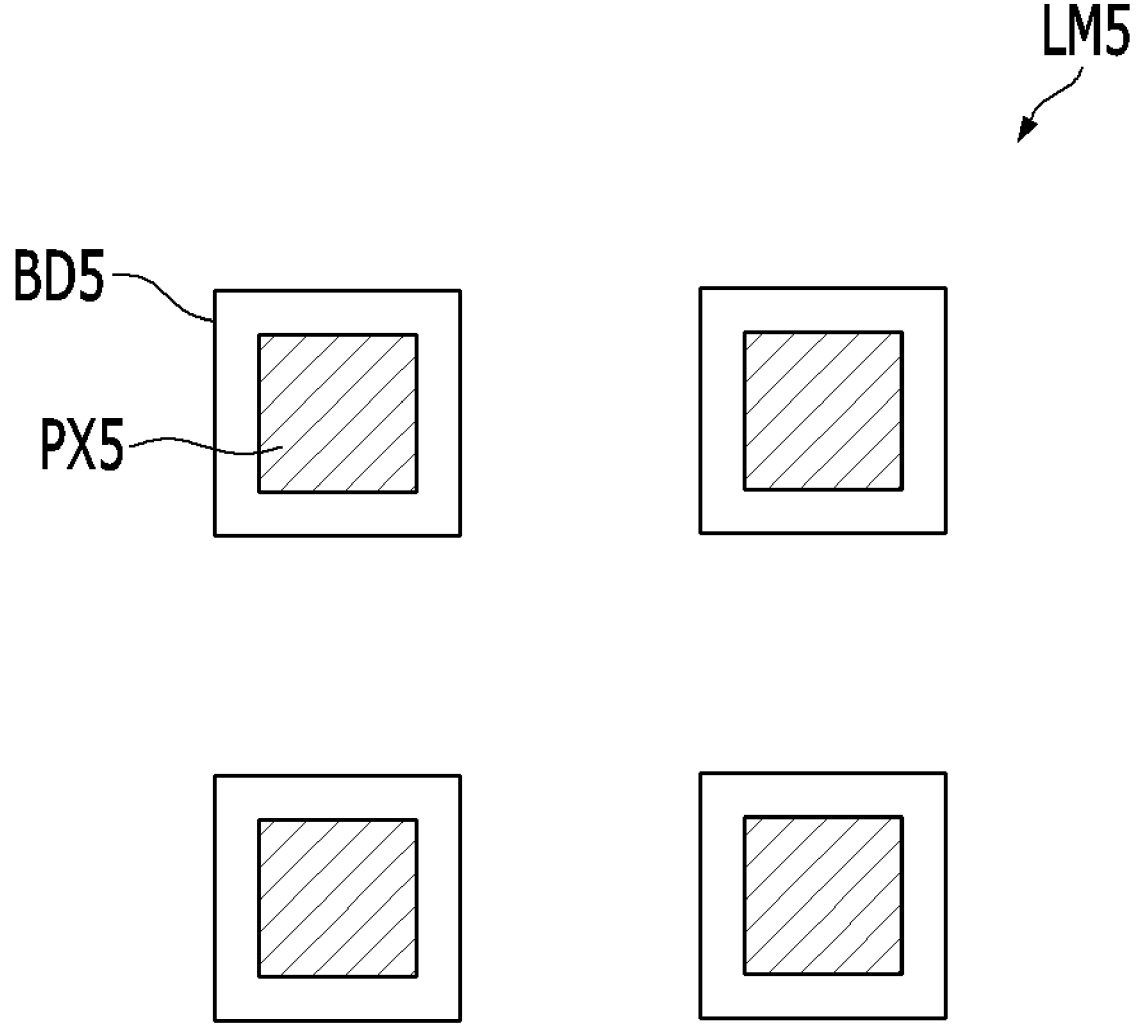
FIG. 13 is an exemplary diagram illustrating a fifth light-emitting module according to one embodiment of the present disclosure.

Referring to FIG. 13, the fifth light-emitting module LM5 may include fifth bodies BD5 and fifth pixels PX5. Although not shown in the drawing, in another embodiment of the present disclosure, the fifth light-emitting module LM5 may further include fifth connectors extending from the fifth body BD5.

The fifth body BD5 may be disposed on the fourth adhesive member AD4.

The fifth pixel PX5 may be disposed on the fifth body BD5. The fifth pixel PX5 may include a fifth light-emitting element.

In the present specification, any one among the first to fourth pixels PX1 to PX4 disposed below another pixel in the first state may be a sixth pixel, and a light-emitting element included in the sixth pixel may be a sixth light-emitting element.

Figure 14A:
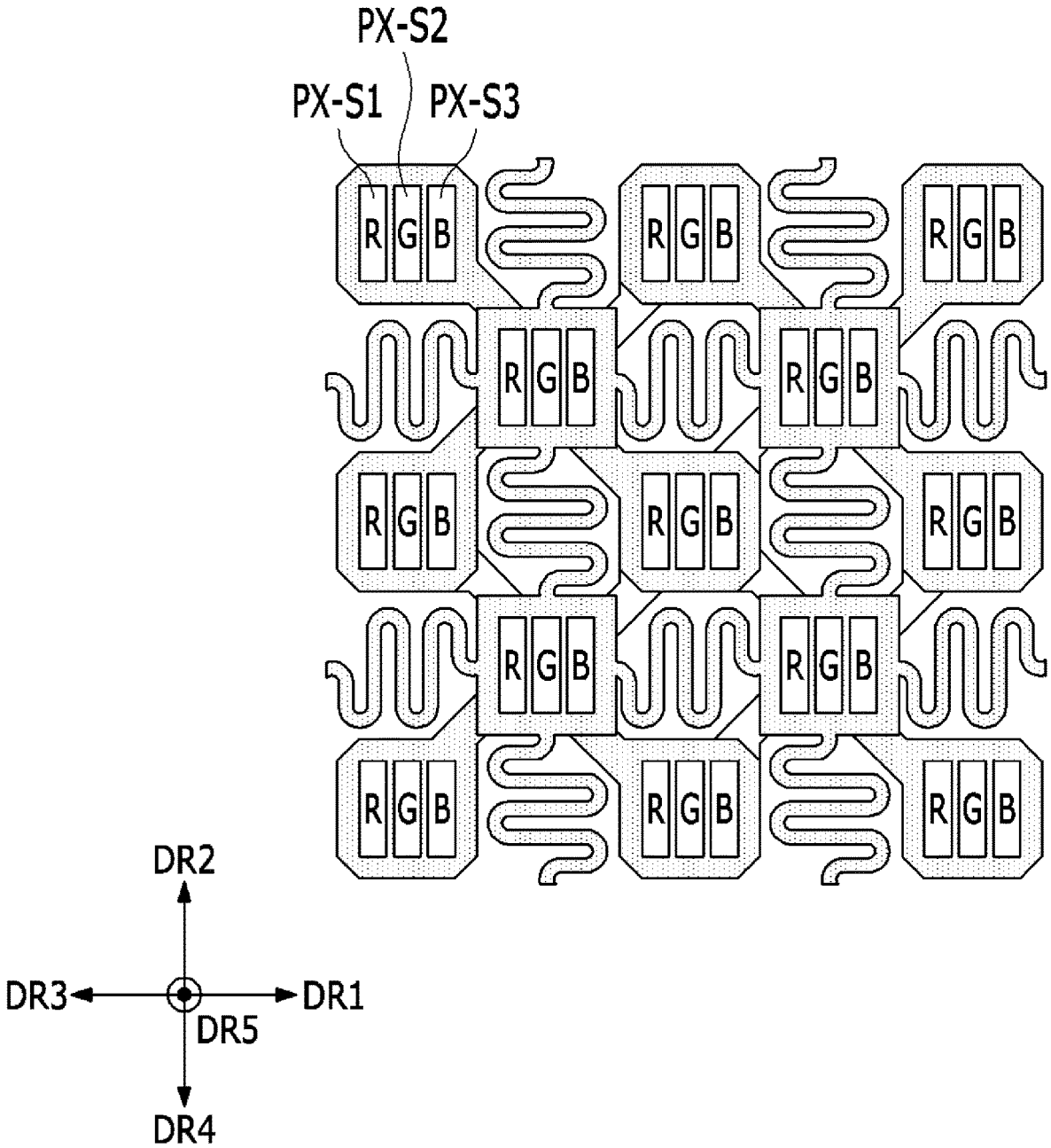
FIG. 14A is an enlarged view illustrating a portion of the display panel when the display module according to one embodiment of the present disclosure is in the first state of FIG. 1.
Figure 14B:
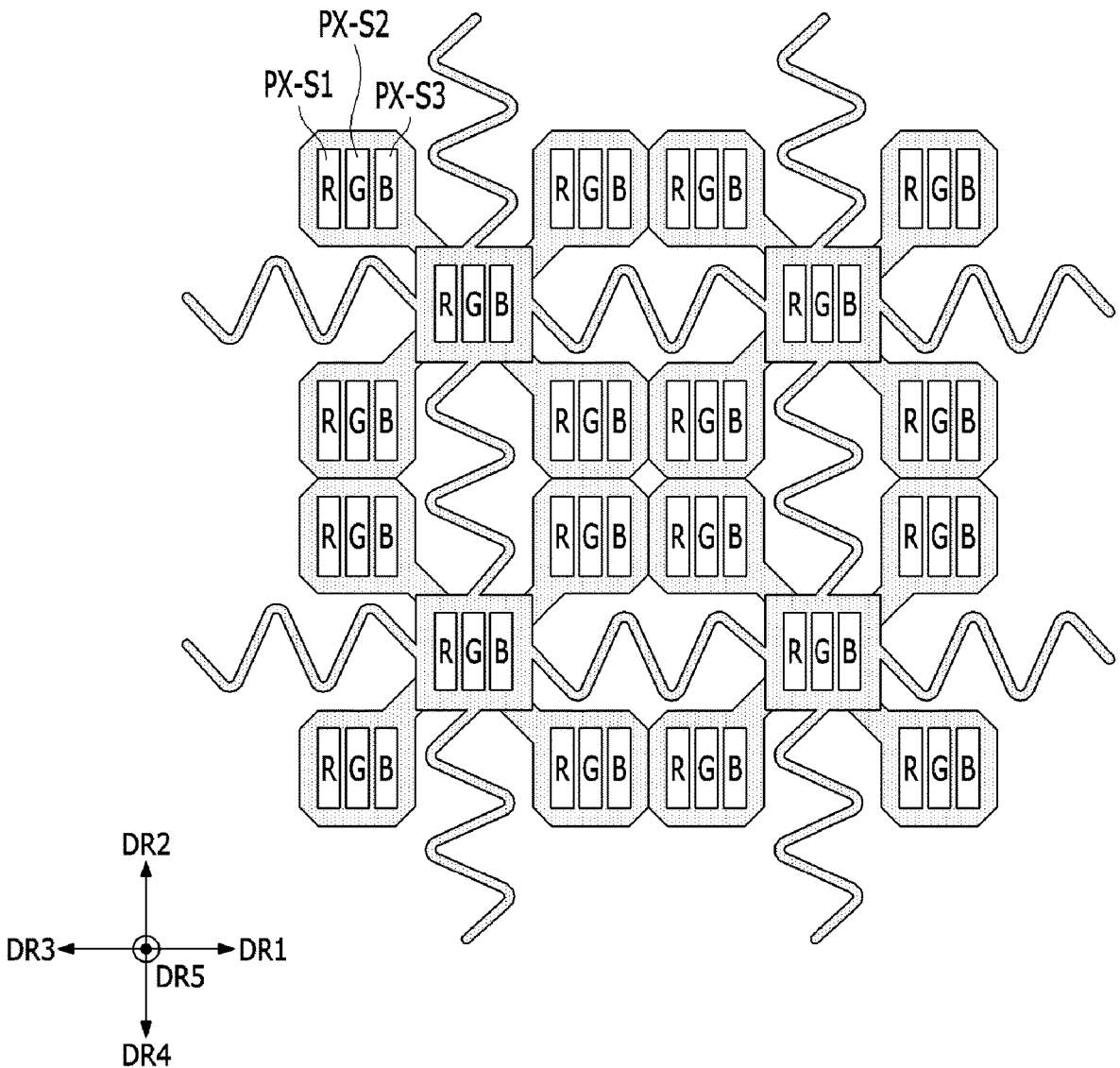
FIG. 14B is an enlarged view illustrating a portion of the display panel when the display module according to one embodiment of the present disclosure is in the second state of FIG. 2.

FIG. 14A is an enlarged view illustrating a portion of the display panel DP when the display module DM according to one embodiment of the present disclosure is in the first state of FIG. 1. FIG. 14B is an enlarged view illustrating a portion of the display panel DP when the display module DM according to one embodiment of the present disclosure is in the second state of FIG. 2.

In one embodiment of the present disclosure, the display panel DP may include a first sub-pixel PX-S1, a second sub-pixel PX-S2, and a third sub-pixel PX-S3. The first sub-pixel PX-S1 may emit red light, the second sub-pixel PX-S2 may emit green light, and the third sub-pixel PX-S3 may emit blue light.

Figure 15A:
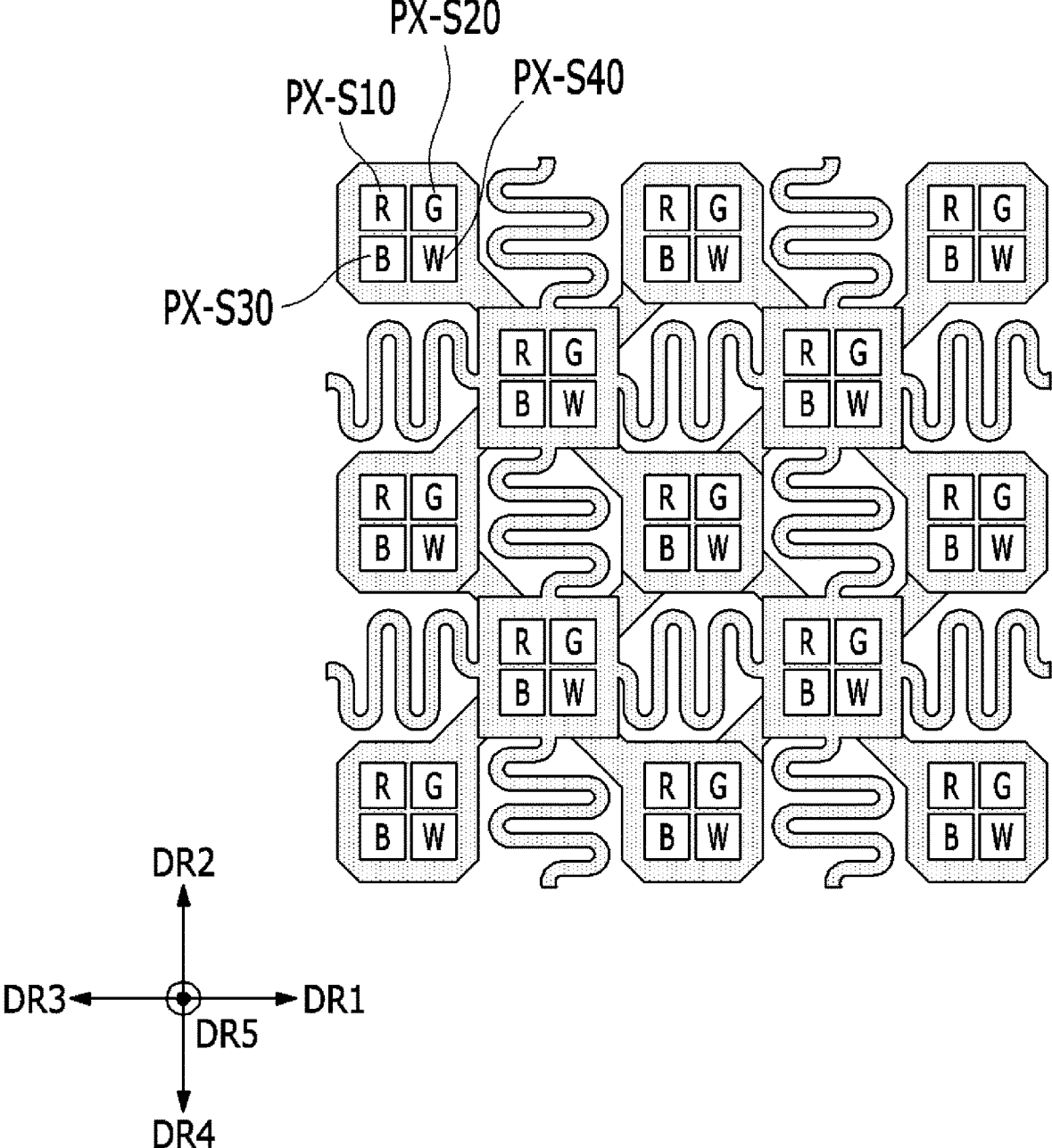
FIG. 15A is an enlarged view illustrating a portion of the display panel when the display module according to one embodiment of the present disclosure is in the first state of FIG. 1.
Figure 15B:
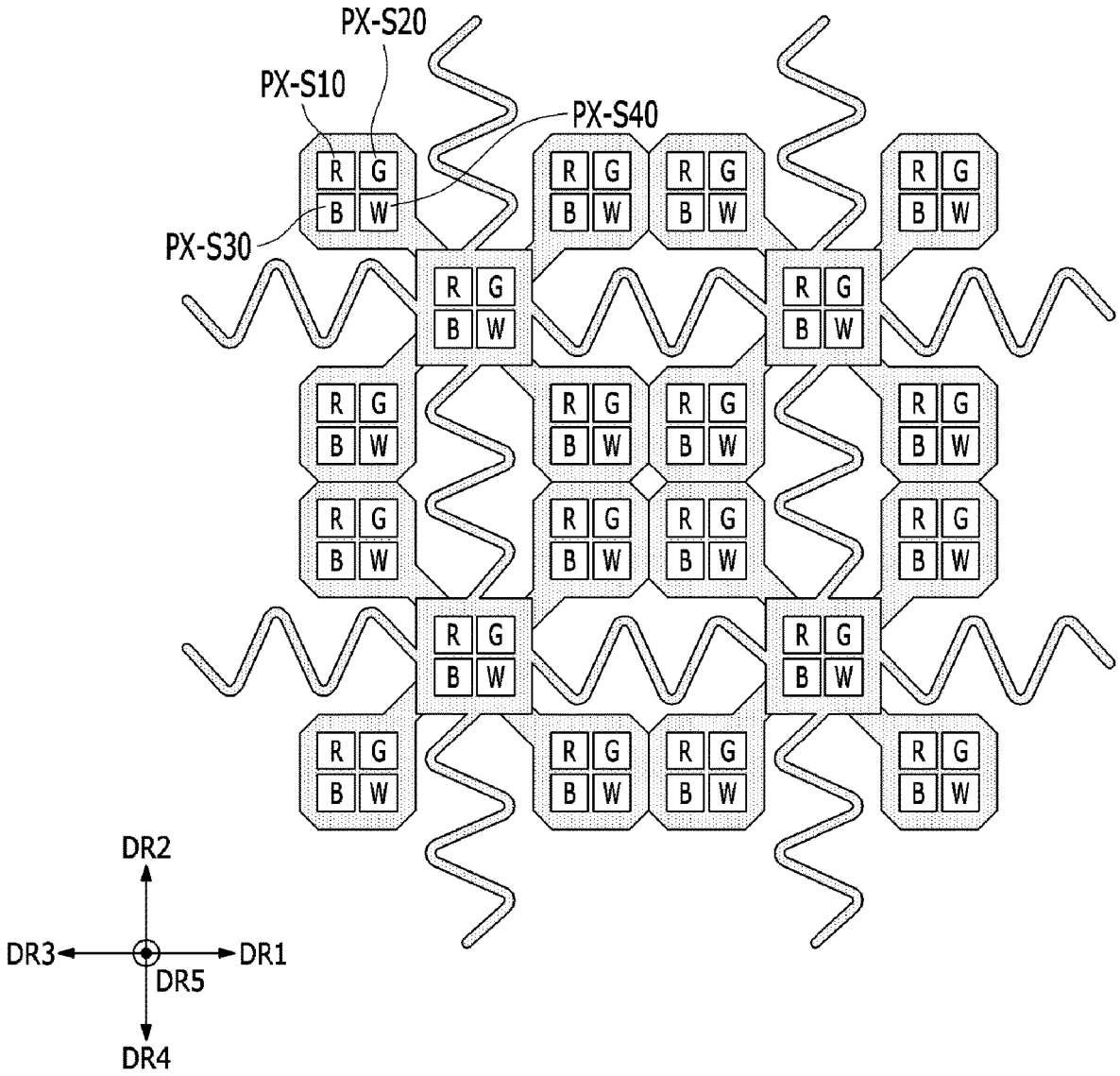
FIG. 15B is an enlarged view illustrating a portion of the display panel when the display module according to one embodiment of the present disclosure is in the second state of FIG. 2.

FIG. 15A is an enlarged view illustrating a portion of the display panel DP when the display module DM according to one embodiment of the present disclosure is in the first state of FIG. 1. FIG. 15B is an enlarged view illustrating a portion of the display panel DP when the display module DM according to one embodiment of the present disclosure is in the second state of FIG. 2.

In one embodiment of the present disclosure, the display panel DP may include a first sub-pixel PX-S10, a second sub-pixel PX-S20, a third sub-pixel PX-S30, and a fourth sub-pixel PX-S40. The first sub-pixel PX-S10 may emit red light, the second sub-pixel PX-S20 may emit green light, the third sub-pixel PX-S30 may emit blue light, and the fourth sub-pixel PX-S40 may emit white light.

In accordance with the embodiments of the present disclosure, a stretchable display device maintaining a constant resolution in the process of being stretched can be provided.

Although the description has been made with reference to the embodiments of the present disclosure, it should be understood that various alternations and modifications of the present disclosure can be devised by those skilled in the art to which the present disclosure pertains without departing from the spirit and scope of the present disclosure, which are defined by the appended claims. In addition, the embodiments disclosed in the present disclosure are not intended to limit the technical idea of the present disclosure, and all technical ideas within the scope of the following claims and their equivalents should be construed as being included in the scope of the present disclosure.

What is claimed is:

1. A stretchable display panel comprising:
   a first light-emitting module, a second light-emitting module, a third light-emitting module,
   wherein the first light-emitting module includes:
   a first body;
   a plurality of first connectors extending from the first body in different directions and each having a predetermined elastic force;
   a first satellite portion extending from the first body in a direction different from the directions of the plurality of first connectors;

a first adhesive member disposed on the first body; and a first light-emitting element disposed on the first satellite portion, and the second light-emitting module includes:

a second body disposed on the first adhesive member;

a plurality of second connectors extending from the second body in different directions and each having a predetermined elastic force;

a second satellite portion extending from the second body in a direction different from the directions of the plurality of second connectors and not overlapping the first satellite portion;

a second adhesive member disposed on the second body; and a second light-emitting element disposed on the second satellite portion, and the third light-emitting module includes:

a third body disposed on the second adhesive member;

a plurality of third connectors extending from the third body in different directions and each having a predetermined elastic force;

a third satellite portion extending from the third body in a direction different from the directions of the plurality of third connectors and not overlapping the first satellite portion and the second satellite portion;

a third adhesive member disposed on the third body; and a third light-emitting element disposed on the third satellite portion.

2. The stretchable display panel of claim 1, further comprising:

a fourth light-emitting module, wherein the fourth light-emitting module includes:

a fourth body disposed on the third adhesive member;

a plurality of fourth connectors extending from the fourth body in different directions and each having a predetermined elastic force;

a fourth satellite portion extending from the fourth body in a direction different from the directions of the plurality of fourth connectors and not overlapping the first satellite portion, the second satellite portion, and the third satellite portion;

a fourth adhesive member disposed on the fourth body; and a fourth light-emitting element disposed on the fourth satellite portion.

3. The stretchable display panel of claim 2, further comprising:

a fifth light-emitting module, wherein the fifth light-emitting module includes:

a fifth body disposed on the fourth adhesive member; and a fifth light-emitting element disposed on the fifth body.

4. The stretchable display panel of claim 3, wherein the fifth light-emitting element is disposed between the first light-emitting element and the third light-emitting element on a flat surface.

5. The stretchable display panel of claim 4, wherein the fifth light-emitting element is disposed between the second light-emitting element and the fourth light-emitting element on a flat surface.

6. The stretchable display panel of claim 3, further comprising:

a sixth light-emitting element, wherein the fourth light-emitting element and the sixth light-emitting element overlap in a first state; and the fourth light-emitting element and the sixth light-emitting element do not overlap in a second state.

7. The stretchable display panel of claim 6, wherein light emitted from the fourth light-emitting element has the same color as light emitted from the sixth light-emitting element.

8. The stretchable display panel of claim 6, wherein both the fourth light-emitting element and the sixth light-emitting element are turned on in the first state and the second state.

9. The stretchable display panel of claim 6, wherein:

any one of the fourth light-emitting element and the sixth light-emitting element is turned on in the first state; and both the fourth light-emitting element and the sixth light-emitting element are turned on in the second state.

10. A stretchable display panel comprising:

a base member;

a first light emission portion including a plurality of first light-emitting elements disposed on the base member; and a second light emission portion including a plurality of second light-emitting elements disposed on the base member, wherein, in a first state in which the base member is not stretched, some of the plurality of first light-emitting elements overlap some of the plurality of second light-emitting elements, half of overlapping light-emitting elements among the plurality of first light-emitting elements and the plurality of second light-emitting elements are turned on, and the other half of the overlapping light-emitting elements thereof are turned off, and wherein, in a second state in which the base member is stretched, the plurality of first light-emitting elements do not overlap the plurality of second light-emitting elements, and all the plurality of first light-emitting elements and the plurality of second light-emitting elements are turned on.

11. The stretchable display panel of claim 10, wherein the plurality of first light-emitting elements are disposed on different layers.

12. The stretchable display panel of claim 11, wherein the plurality of second light-emitting elements are disposed on different layers.

13. The stretchable display panel of claim 10, wherein, in the first state, light-emitting elements overlapping each other among the plurality of first light-emitting elements and the plurality of second light-emitting elements emit the same color of light.

14. A stretchable display panel comprising:

a first light-emitting module, a second light-emitting module, and a third light-emitting module, wherein the first light-emitting module includes:

a first body;

a plurality of first connectors extending from the first body in different directions and each having a predetermined elastic force;

a first satellite portion extending from the first body in a direction different from the directions of the plurality of first connectors; and a first light-emitting element disposed on the first satellite portion, and the second light-emitting module includes:

a second body disposed on the first body;

a plurality of second connectors extending from the second body in different directions and each having a predetermined elastic force;

a second satellite portion extending from the second body in a direction different from the directions of the plurality of second connectors and not overlapping the first satellite portion; and a second light-emitting element disposed on the second satellite portion, and the third light-emitting module includes:

a third body disposed on the second body;

a plurality of third connectors extending from the third body in different directions and each having a predetermined elastic force;

a third satellite portion extending from the third body in a direction different from the directions of the plurality of third connectors and not overlapping the first satellite portion and the second satellite portion; and a third light-emitting element disposed on the third satellite portion.

15. The stretchable display panel of claim 14, further comprising:

a fourth light-emitting module, wherein the fourth light-emitting module includes:

a fourth body disposed on the third body;

a plurality of fourth connectors extending from the fourth body in different directions and each having a predetermined elastic force;

a fourth satellite portion extending from the fourth body in a direction different from the directions of the plurality of fourth connectors and not overlapping the first satellite portion, the second satellite portion, and the third satellite portion; and a fourth light-emitting element disposed on the fourth satellite portion.

16. The stretchable display panel of claim 15, further comprising:

a fifth light-emitting module, wherein the fifth light-emitting module includes a fifth light-emitting element disposed on the fourth body.

* * * * *